US005123051A

United States Patent [19]

Koinuma

[11] Patent Number: 5,123,051

[45] Date of Patent: Jun. 16, 1992

[54] SOUND FIELD REPRODUCING APPARATUS

[75] Inventor: Hiroshi Koinuma, Tokyo, Japan

[73] Assignee: Pioneer Electronic Corporation, Tokyo, Japan

[21] Appl. No.: 670,465

[22] Filed: Mar. 13, 1991

Related U.S. Application Data

[63] Continuation of Ser. No. 398,902, Aug. 28, 1989, abandoned.

[30] Foreign Application Priority Data

Jan. 12, 1989 [JP] Japan ................................ 1-2325[U]

[51] Int. Cl.[5] ................................ H03G 3/00

[52] U.S. Cl. ................................ 381/63

[58] Field of Search ................................ 381/17, 63, 64, 1; 84/630, 707

[56] References Cited

U.S. PATENT DOCUMENTS 2,879,683 3/1959 Martin ................................ 381/63
3,087,988 4/1963 Somer ................................ 381/17
3,535,453 10/1970 Veneklasen ................................ 381/64
3,541,260 11/1970 Jarvis ................................ 381/63
4,332,979 6/1982 Fischer ................................ 381/18
4,628,789 12/1986 Fujimori ................................ 381/63
4,856,064 8/1989 Iwamatsu ................................ 381/18

*Primary Examiner*—Forester W. Isen
*Attorney, Agent, or Firm*—Fleit, Jacobson, Cohn, Price, Holman & Stern

[57] ABSTRACT

A sound field reproduction apparatus comprises a reflectional sound signal generating circuits for generating quasi-reflectional sound signals by summing a plurality of delay signals obtained by delaying source signals in order, and amplifiers for amplifying the level of quasi-reflectional sound signals. The apparatus is characterized by a signal selecting and repeating device for alternatively repeating either the quasi-reflectional sound signals and the source signals, or source signals different from the above-described source signals. With this feature, it becomes possible to reproduce source signals other than the source signals for use in the sound field reproduction.

7 Claims, 2 Drawing Sheets

SOUND FIELD REPRODUCING APPARATUS

This application is a continuation of application Ser. No. 07/398,902, filed Aug. 28, 1989 now abandoned.

BACKGROUND OF THE INVENTION

1. Field of the Invention

The present invention relates to a sound field reproducing apparatus.

2. Description of Background Information

Sound field reproduction apparatuses are generally structured to generate quasi-reflectional sound signals from input signals, and to drive a plurality of sub-speaker systems for generating quasi-reflectional sounds. Consequently those apparatuses have complex circuit constructions, and are relatively expensive. Accordingly there are demands that a sound field reproduction apparatus is utilized effectively also when the sound field reproduction is not effected by the apparatus.

OBJECT AND SUMMARY OF THE INVENTION

An object of the present invention is to provide a sound field reproduction apparatus which is capable of the sound field reproduction and also another function.

In order to attain the above object, a sound field reproduction apparatus according to the present invention comprises a reflectional sound signal generating means for generating quasi-reflectional sound signals by summing a plurality of delay signals obtained by delaying source signals in order, and amplifiers for amplifying the level of quasi-reflectional sound signals, and the apparatus further includes signal selecting and repeating means for alternatively repeating either the quasi-reflectional sound signals and the source signals, or source signals different from the above-described source signals.

DETAILED DESCRIPTION OF A PREFERRED EMBODIMENT

Before entering into the explanation of the embodiment of the present invention an example of conventional sound field reproducing apparatus will be explained with reference to FIG. 1.

Figure 1:
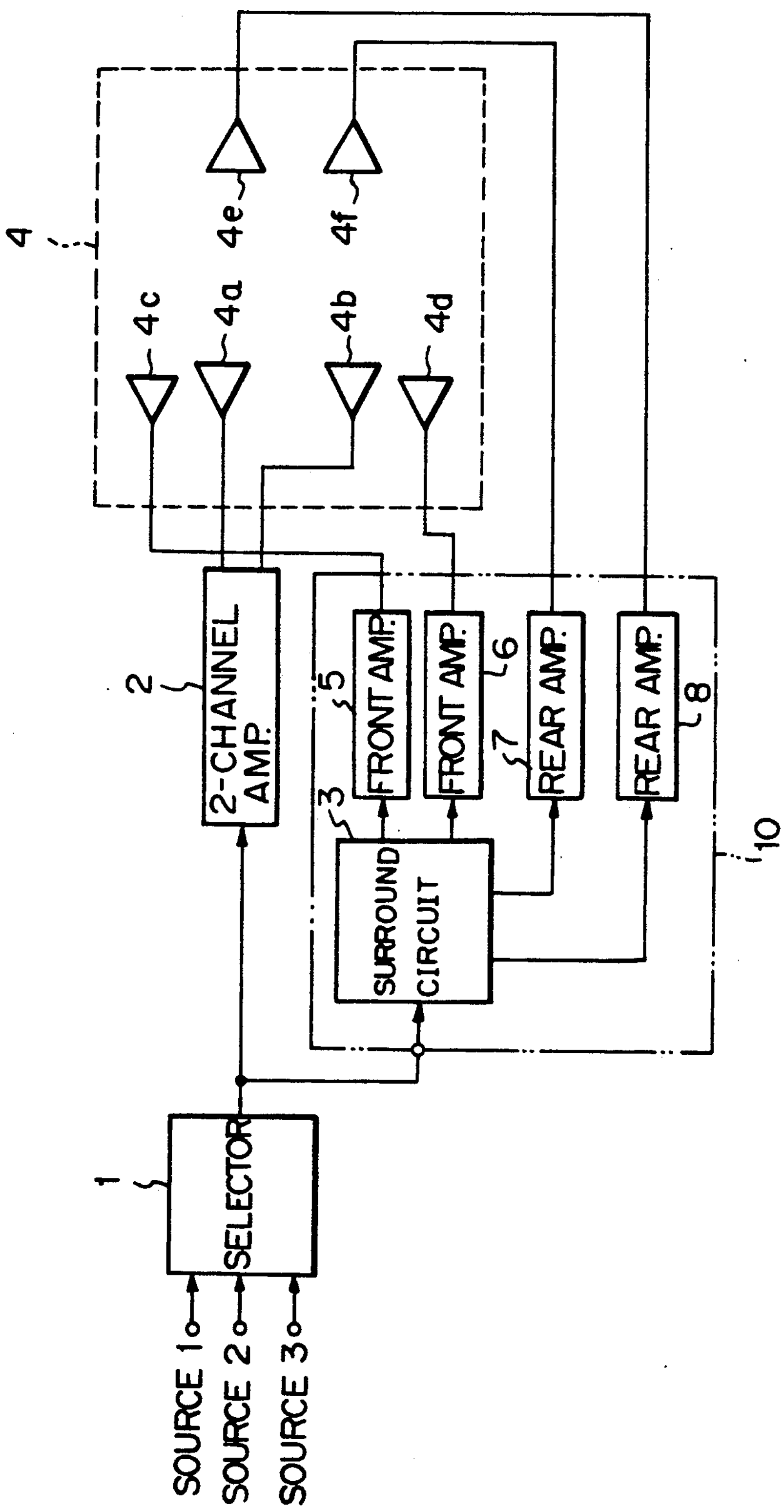
FIG. 1 is a block diagram showing an example of conventional sound field reproducing apparatus.

In FIG. 1, signals from sources 1 through 3 are supplied to a selector 1. For, example, the source 1 is a video disc player and stereophonic signals are supplied from the video disc player. The source 2 is a CD player and also stereophonic signals are supplied from the CD player. The third stereophonic signals are supplied from an FM tuner serving as the source 3. Further, the signals from these sources may be monaural signals.

In accordance with the designation of an operator, the selector 1 selects signals from one of sources 1 through 3 and supplies them to a two-channel amplifier 2 and a surround circuit 3. The two-channel amplifier 2 is made up of two separate amplifiers for respectively amplifying the left and right signals of source signals, i.e. signals from the selected source. The left and right signals amplified in power are supplied to main speaker systems 4*a* and 4*b* which are symmetrically placed a little to the center, at a front end of a listening-room.

The surround circuit 3 is made up of three or more reflectional sound circuits each of which includes a plurality of series circuits connected in parallel with each other, each of the series circuit being made up of a delay circuit for delaying the source signal and an amplifier for amplifying the output signal of the delay circuit. As an example, the surround circuit 3 shown in the figure is made up of three reflectional sound circuits. The reflectional sound circuits generate quasi-reflectional sound signals. Parameters used in the reflectional sound circuits, such as the delay time of the delay circuits and the amplification factor of the amplifiers of each reflectional sound circuit, are determined by a microprocessor (not shown) in the surround circuit 3. The microprocessor is configured to read-out data, which corresponds to a sound field to be reproduced, from a ROM. The quasi-reflectional sound signal outputs of first and second reflectional sound circuits are respectively supplied to front amplifiers 5 and 6, amplified in power by the front amplifiers 5 and 6, and supplied to front sub-speaker systems 4*c* and 4*d* which are placed at the left and right sides of the front end of the listening room.

The quasi-reflectional sound signal outputs of the third and fourth reflectional sound circuits are respectively supplied to rear amplifiers 7 and 8 and supplied to rear sub speaker systems 4*e* and 4*f* which are arranged on the left and right sides of a rear end of the listening room 4. The surround circuit 3 and the amplifiers 5 and 8 constitute the sound field reproducing circuit 10.

In this way, at the time of the playback of a two-channel stereo, a concert-hall presence is obtained in the listening room 4 by adding the quasi-reflectional sounds by the front and rear sub-speaker systems.

This sound field reproduction apparatus driving a plurality of sub-speaker systems for generating quasi-reflectional sounds is relatively expensive. Therefore, as mentioned before, it is desirable that the apparatus is utilized effectively also when the sound field reproduction is not performed.

An embodiment of the sound field reproducing apparatus will be described with reference to FIG. 2.

Figure 2:
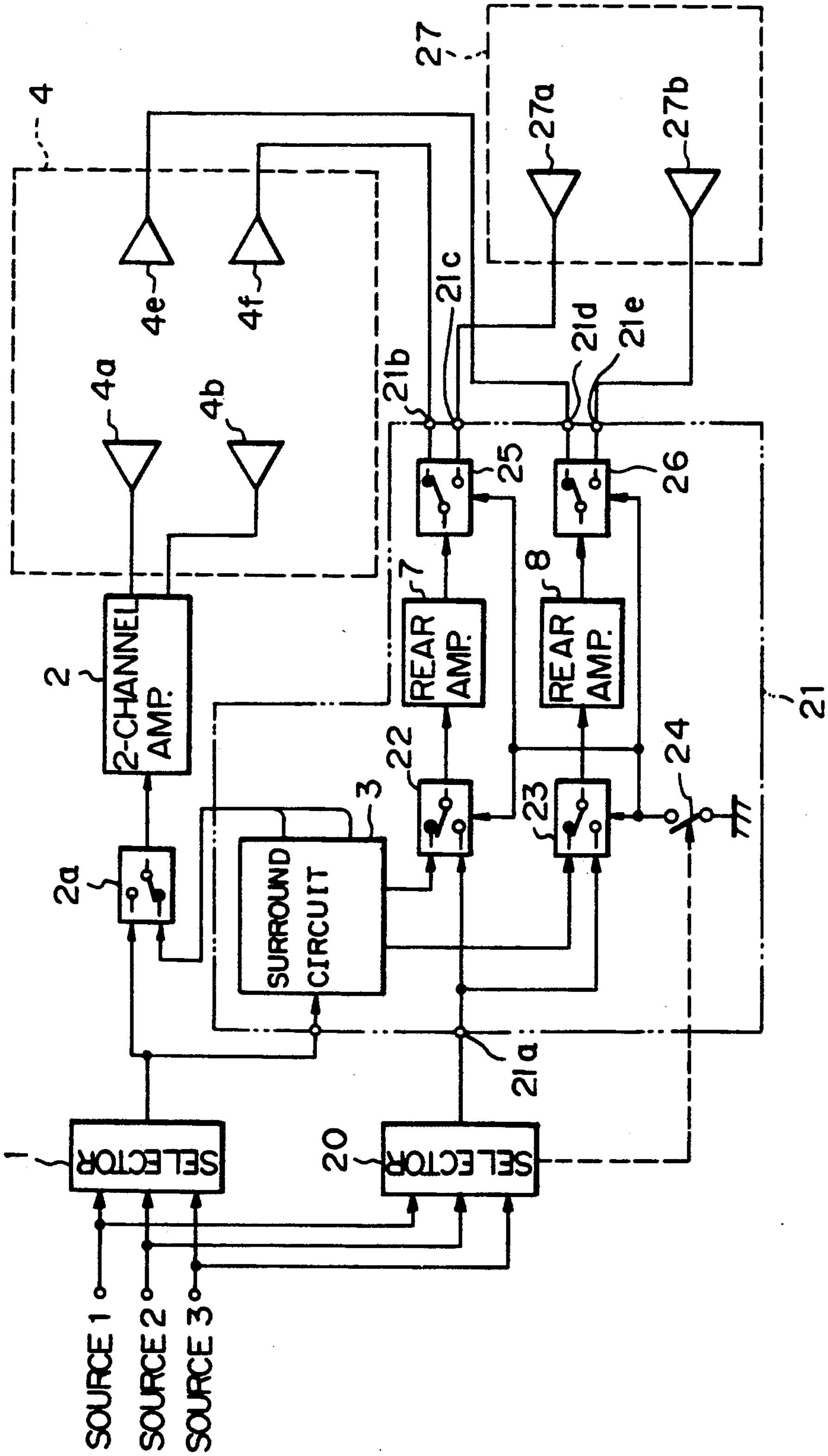
FIG. 2 is a block diagram showing an embodiment of the sound field reproducing apparatus according to the present invention.

Like reference numerals are used to denote like parts or corresponding elements in FIGS. 1 and 2, and the explanation of element the same as the parts shown in FIG. 1 will not be repeated.

In the circuit arrangement shown in FIG. 2, with the operation of a signal selecting circuit 2*a*, the two-channel amplifier 2 is commonly used in both of the case where the surround reproduction is performed and the case where the surround reproduction is not performed. With this construction, the front amplifiers 5 and 6 are eliminated in this arrangement, to save the cost. Furthermore, the selector 20 is provided independently of the selector 1, and signals from sources 1 through 3 are also supplied to input terminals of the selector 20. The source signals selected by the selector 20 are respectively supplied to one input terminal of each of relay switches 22 and 23 through an input terminal 21*a* of the sound field reproducing apparatus 21. To the other input terminal of each of the relay switches 22 and 23, quasi-rear reflectional sound signals are respectively supplied from the third and fourth reflectional sound circuit of the surround circuit 3. The relay switches 22 and 23 are configured to select one of two input signals and supply it to the rear amplifiers 7 and 8 respectively, in response to the closing command signal supplied from a switch 24. The output signal of the relay switch 7 amplified in power by the rear amplifier 7 is supplied to a common input terminal of a relay switch 25 which operates in response to the above-mentioned closing command signal. The relay switch 25 is configured to supply the amplified output signal to the rear speaker 4*e* in the listening room 4 through an output terminal 21*b* when the closing command signal is not present. On the other hand, when the closing command signal is present the relay switch 25 supplies the amplified output signal to a speaker 27*a* placed in another room (or in other words, acoustic space) through an output terminal 21*c*.

On the other hand, the output signal of the relay switch 23 which has been amplified by the rear amplifier 8 is supplied to the a common input terminal of a relay switch 26. When the above-mentioned closing command signal is not present, the relay switch 26 supplies the amplified output signal to the rear speaker in the listening room 4 through an output terminal 21*d*, and supplies it to a speaker 27*b* in the room 27 through an output terminal 21*e* when the above-mentioned closing command signal is not present.

With this arrangement, when the sound field is to be reproduced in the listening room 4, the output signals of the surround circuit 3 are repeated to the two channel amplifier 2 through the signal selecting circuit 2*a*, and the switch 24 is operated to its open state. As a result, the quasi-reflectional sound signals from the surround circuit 3 are selected by the relay switches 22 and 23, and amplified by the rear amplifiers 7 and 8. This quasi-reflectional sound signals after having been amplified are supplied to the rear speakers 4*e* and 4*f* in the listening room 4 through the relay switches 25 and 26 so that the sound field is reproduced as with the conventional apparatus.

On the other hand, when the sound from the signal source is to be listened in the room 27, the switch 24 is closed so that the closing command signal is supplied to the relay switches 22, 23, 25 and 26. When these relay switches are switched over, the source signals from the source selected by the listener at the selector 20 are amplified in power by the rear amplifiers 7 and 8, and respectively supplied to the speakers 27*a* and 27*b* placed in the room 27. Therefore, a sound from a desired source can be listened in the room 27. In this state, it is possible to reproduce the sound field in the listening room 4 by using the speakers 4*a* and 4*b*.

In this way, the amplifiers of the sound field reproducing apparatus are used both for the power amplification of the output signals of the surround circuit 3 and the amplification of the source signals. This means that the sound field reproducing apparatus can be versatilely utilized.

In addition, as illustrated by the dashed line in the FIG. 2, the apparatus may be configured that the switch 24 is interconnected with the selector 20, so that it is automatically switched when source signals of any one source are selected by the selector 20.

Furthermore, it is also possible to arrange the apparatus such that the two channel amplifier 2 amplifies selectively either of the source signals or quasi-reflectional sound signals, as with the rear amplifiers.

Moreover, by adopting an arrangement that the relay switches 22, 23, 25 and 26 are operated independently, the source signals from another source can be reproduced by the rear sub-speakers, for example, when the source signals from one source is reproduced in the listening room 4.

As explained in the foregoing, in the case of the sound field reproducing apparatus according to the present invention, a signal selecting and repeating means is provided between the reflectional sound generating circuit which derives quasi-reflectional sound signals from the selected source signals and amplifiers which amplify the level of the output signals of the reflectional sound generating circuit, and selected ones among a plurality of original source signals and the above-described quasi-reflectional sound signals are supplied to the above-described amplifiers. Therefore, the sound of source signals which are different from source signals to be used for the reproduction of the sound field can be listened without using any additional power amplifiers which generally require a high additional cost.

What is claimed is:

1. A sound reproduction system comprising:
   - signal input means for receiving a plurality of independent input signals from a plurality of signal sources;
   - first selecting means for selectively transmitting at least one input signal from one of said plurality of signal sources receives by said input means;
   - second selecting means for selectively transmitting at least one input signal from one of said plurality of signal sources received by said input means;
   - a first amplifier for amplifying said at least one input signal selected by said first selecting means and producing output signals;
   - a second amplifier;
   - first and third sets of speakers placed in a first listening room;
   - a second set of speakers placed in a second listening room;
   - first supply means for supplying said output signals of said first amplifier to said first set of speakers;
   - reflectional sound generating means connected to said first selecting means, for generating, by using said at least one input signal selected by said first selecting means, a first reflectional sound signal to be supplied to said first amplifier and a second reflection sound signal;
   - input selecting means for selectively supplying one of said second reflectional sound signal and said at least one input signal selected by said second selecting means to said second amplifier; and
   - second supply means for supplying output signals of said second amplifier to said third set of speakers placed in said first listening room when said second reflectional sound signal is selectively supplied by said input selecting means, and supplying output signals of said second amplifier to said second set of speakers placed in said second listening room when said at least one input signal selected by said second selecting means is selectively supplied by said input selecting means.

2. A sound reproduction system comprising:
   - signal input means for receiving a plurality of input signals from a plurality of signal sources;
   - first selecting means for selectively transmitting at least one input signal from one of said plurality of signal sources received by said input means;
   - second selecting means for selectively transmitting at least one input signal from one of said plurality of signal sources received by said input means;

first amplifying means for amplifying said at least one input signal selected by said first selecting means and producing output signals;

reflectional sound signal generating means connected to said first selecting means for generating as output first and second sets of reflectional sound signals from said at least one input signal selected by said first selecting means;

first signal switching means having a first switch position for supplying said first set of reflectional sound signals generated by said reflectional sound signal generating means to said first amplifying means and a second switch position for supplying said at least one input signal of said one of said plurality of signal sources received by said input means to said first amplifying means;

second amplifying means for amplifying said at least one input signal selected by said second selecting means and producing output signals;

second signal switching means having a first switch position for supplying said second set of reflectional sound signals generated by said reflectional sound signal generating means to said second amplifying means and a second switch position for supplying said at least one input signal selected by said second selecting means to said second amplifying means;

a first set of speakers placed in a first room;

a second set of speakers placed in a second room;

first supply means for supplying said output signals of said first amplifying means to said first set of speakers;

second supply means for supplying said output signals of said second amplifying means to said second set of speakers;

a third set of speakers placed in said first room; and third signal switching means connected to said second amplifying means having a first switch position for supplying said output signals of said second amplifying means to said third set of speakers and a second switch position for supplying said output signals of said second amplifying means to said second set of speakers.

3. The sound reproduction system of claim 2, and further comprising interlocking means, responsive to an operation of said second selecting means, for causing said second and third signal switching means to select their respective second switch positions when an input signal from a predetermined one of said plurality of signal sources is selected by said second selecting means.

4. A sound reproduction system comprising:

signal input means for receiving a plurality of input signals to be reproduced;

first source signal selecting circuit for selecting for output one of said input signals received by said signal input means;

signal selecting means having a first input terminal for receiving the output of the first source signal selecting circuit and a second input terminal, and selecting for output one of said input signals applied to said first or second input terminals thereof;

second source signal selecting circuit for selecting for output one of said plurality of input signals;

two-channel amplifier means for amplifying the output of said signal selecting means;

first and second pairs of speakers placed in a first room where it is desired to produce concert hall sound, said first pair of speakers being connected to said two-channel amplifier means;

a third pair of speakers placed in a second room where it is desired to produce regular sound;

sound field reproducing means comprising:

reflectional sound signal generating means receiving as input the output of said first source signal selecting circuit and generating as output first, second, third and fourth reflectional sound signals by delaying the input signal to produce delay signals and adding the delay signals in sequence, the first and second reflectional sound signals of said reflectional sound signal generating means being applied to the second input terminal of said signal selection means;

first relay switch having a first input terminal receiving the output of the second source signal selecting circuit and a second input terminal receiving the third reflectional sound signal of said reflectional sound signal generating means, said first relay switch supplying as output one of the signals applied to the first or second input terminal thereof;

second relay switch having a first terminal receiving the output of said second source signal selecting circuit and a second input terminal receiving the fourth reflectional sound signal of said reflectional sound signal generating means, said second relay switch means supplying as output one of the signals applied to the first or second input terminal thereof;

first amplifier means connected to the output of said first relay switch for amplifying the output thereof;

second amplifier means connected to the output of said second relay switch for amplifying the output thereof;

third relay switch means for receiving the output of the first amplifier and connecting the output of the first amplifier to either a first speaker of said second pair of speakers in the first room or a first speaker of said third pair of speakers in the second room;

fourth relay switch means for receiving the output of the second amplifier and connecting the output of the second amplifier to either a second speaker of said second pair of speakers in the first room or a second speaker of said third pair of speakers in the second room; and switch control means for controlling the first, second, third and fourth relay switch means, so that when it is desired to listen to concert hall sound of one of said plurality of input signals, the first and second relay switch means are caused to select the signals on their respective first input terminals, the third and fourth relay switch means are caused to connect the outputs of the first and second amplifier means, respectively, to the first and second speakers of the second pair of speakers in the first room, and the signal selecting means is caused to select the signal on the second input terminal thereof to connect the first and second reflectional sound signals to the two channel amplifier means, and when it is desired to listen to normal sound reproduction in the second room, the first and second relay switch means are caused to select the signals on their respective second input terminals, the third and fourth relay switch means are caused to connect the outputs of the first and second amplifier means, respectively, to the first and second speakers of the third pair of speakers in the second room.

5. The sound reproduction system of claim 4, wherein the second source signal selecting circuit generates a command signal upon operation, said command signal indicative of the desire to listen to normal sound in the second room through the third pair of speakers and being supplied to for controlling each of said first, second, third and fourth relay switch means.

6. The sound reproduction system of claim 4, wherein the signal selecting means is operative to supply the output of the first source signal selecting circuit to the two-channel amplifying means so that normal sound reproduction can be provided through the first pair of speakers in the first room when normal sound reproduction is provided in the second room.

7. A sound reproduction system comprising:

first and second pair of speakers placed in a first room where it is desired to listen to concert sound reproduction;

a third pair of speakers placed in a second room where it is desired to listen to normal sound reproduction;

signal input means for receiving an input signal to be reproduced;

reflectional sound signal generating means for generating reflectional sound signals by producing delay signals of said input signal and adding the delay signals in sequence;

amplifying means for amplifying the level of the reflection sound signals or the input signal and generating an output representative thereof;

first signal selecting means for supplying either the input signal or the reflectional sound signals as input to the amplifying means;

second signal selecting means for connecting the output of the amplifying means to the second pair of speakers or to said third pair of speakers; and control means for controlling the first and second signal selecting means so that when it is desired to listen to concert hall sound reproduction of the input signal in the first room, the first signal selecting means is caused to supply the reflectional sound signals as input to the amplifying means and the second signal selecting means is caused to connect the output of the amplifying means to the second pair of speakers, and when it is desired to listen to normal sound reproduction in the second room, the first signal selecting means is caused to supply the input signals as input to the amplifying means and the second signals selecting means is caused to connect the output of the amplifying means to said third pair of speakers in the second room.

* * * * *